United States Patent [19]

Asano et al.

[11] 4,447,895

[45] May 8, 1984

[54] SEMICONDUCTOR MEMORY DEVICE

[75] Inventors: Masamichi Asano, Tokyo; Hiroshi Iwahashi, Yokohama, both of Japan

[73] Assignee: Tokyo Shibaura Denki Kabushiki Kaisha, Japan

[21] Appl. No.: 192,203

[22] Filed: Sep. 30, 1980

[30] Foreign Application Priority Data

Oct. 4, 1979 [JP] Japan .................................. 54-128392
Nov. 5, 1979 [JP] Japan .................................. 54-143104

[51] Int. Cl.³ ............................................ G11C 11/40
[52] U.S. Cl. ..................................... 365/226; 365/230
[58] Field of Search ................ 365/226, 227, 230, 231

[56] References Cited

U.S. PATENT DOCUMENTS

| | | | |
|---|---|---|---|
| 3,803,554 | 4/1974 | Bock et al. ........................... | 365/227 |
| 3,909,808 | 9/1975 | Cochran et al. ..................... | 365/104 |
| 4,074,237 | 2/1978 | Spampinato ......................... | 365/230 |
| 4,094,012 | 6/1978 | Perlegos et al. ..................... | 365/226 |
| 4,151,611 | 4/1979 | Swgawara et al. .................. | 365/227 |
| 4,194,130 | 3/1980 | Moench ........................... | 365/230 X |

FOREIGN PATENT DOCUMENTS 2001697 7/1970 Fed. Rep. of Germany .
2557006 7/1976 Fed. Rep. of Germany .
2708702 9/1977 Fed. Rep. of Germany .
2716459 1/1978 Fed. Rep. of Germany .

OTHER PUBLICATIONS

Posa, "What to Expect Next: A Special Report", Electronics, May 22, 1980, pp. 119-129.
Dockerty et al., "Enhancement/Depletion Decoder Circuit", IBM Tech. Disclosure Bulletin, vol. 19, No. 5, Oct. 1976, pp. 1681-1682.
Huffman et al., "Memory Address Decode Circuit", IBM Technical Disclosure Bulletin, vol. 19, No. 1, Jun. 1976, pp. 28 and 29.

Primary Examiner—Joseph A. Popek
Attorney, Agent, or Firm—Finnegan, Henderson, Farabow, Garrett & Dunner

[57] ABSTRACT

A semiconductor memory circuit includes a plurality of semiconductor memory areas, a plurality of data lines connected to the memory areas for the transfer of data with respect thereto, a plurality of word lines for transmitting access signals to the memory areas, a column decoder connected to the plurality of data lines and a row decoder having decoding sections respectively connected to the memory areas and switching MOS transistors connected between the decoder sections and a voltage supply terminal. The memory circuit further includes a memory selection circuit connected to the switching MOS transistors of the row decoders for controlling the conduction state of the switching MOS transistors.

5 Claims, 16 Drawing Figures

SEMICONDUCTOR MEMORY DEVICE

This invention relates to a semiconductor memory device which provides a power-down function irrespective of its chip enable mode.

Usually, a semiconductor memory device, which is formed on a semiconductor chip and processes data of one or a plurality of bits, is selectively energized according to a chip enable signal. Some of such semiconductor memory devices have a power-down function, that is, a function of reducing the total power consumption of the semiconductor memory device at the time of the disable mode as compared to that at the time of the enable mode.

Figure 1:
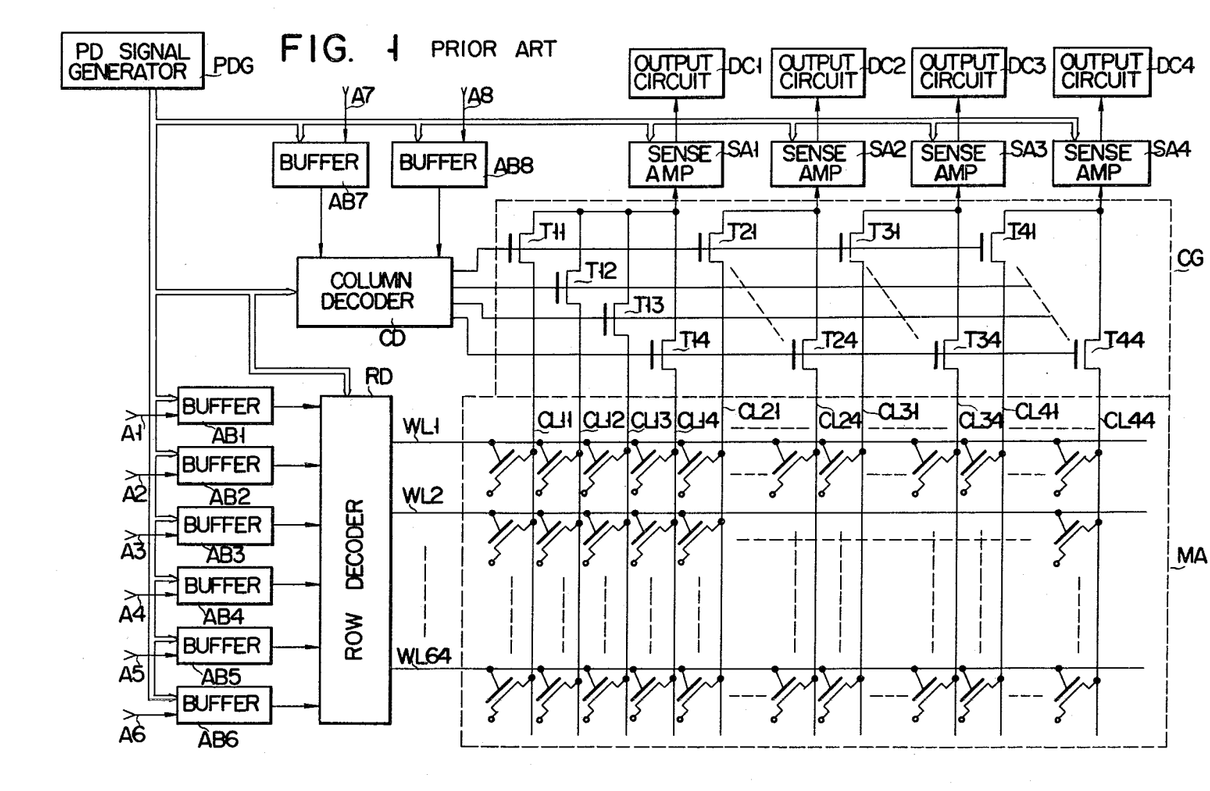
FIG. 1 is a schematic representation of a prior-art semiconductor memory device having a power-down function.

FIG. 1 shows a prior-art semiconductor memory device of this type. It comprises a matrix array MA of memory cells containing 256 words by 4 bits which are selected by row address signals A1 to A6 and column address signals A7 and A8 generated from an address signal generating circuit (not shown). The memory cells in each row of the matrix are connected to each of sixty-four word lines WL1 to WL64 and the memory cells in each column are connected to each of sixteen column lines CL11 to CL14, CL21 to CL24, CL31 to CL34 and CL41 to CL44.

The row address signals A1 to A6 are supplied through respective row address buffer circuits AB1 to AB6 to a row decoder RD. The row decoder RD selectively energizes one of the word lines WL1 to WL64 according to the address signals A1 to A6.

The column address signals A7 and A8 are supplied through respective column address buffer circuits AB7 and AB8 to a column decoder CD. The column decoder CD is provided with four output lines connected to a column gate circuit CG. The column gate circuit CG includes column gate transistors T11 to T14, T21 to T24, T31 to T34 and T41 to T44 connected to the respective column lines CL11 to CL14, CL21 to CL24, CL31 to CL34 and CL41 to CL44. These transistors have their gates each connected to a corresponding one of the four output lines of the column decoder CD and are selectively energized according to the output signal of the column decoder CD.

The column gate transistors T11 to T14 have their drains commonly connected to a sense amplifier SA1, the column gate transistors T21 to T24 have their drains commonly connected to a sense amplifier SA2, the column gate transistors T31 to T34 have their drains commonly connected to a sense amplifier SA3, and the column gate transistors T41 to T44 have their drains commonly connected to a sense amplifier SA4. These sense amplifiers SA1 to SA4 are connected through respective data output circuits DC1 to DC4 to an external control circuit (not shown).

The address buffer circuits AB1 to AB8, row decoder RD, column decoder CD and sense amplifiers SA1 to SA4 are connected to a power-down signal generator PDG, which produces power-down signals PD and $\overline{PD}$ in inverted relationship in response to a chip enable signal. When the chip is disabled, it is set to a low power consumption state by the power-down signals produced from the power-down signal generator PDG.

Figure 2:
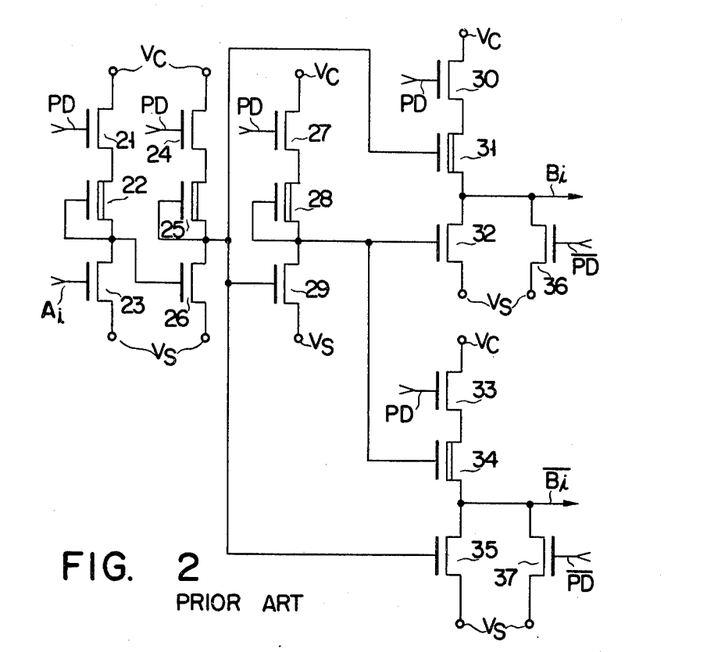
FIG. 2 is a circuit diagram of an address buffer circuit used for forming the semiconductor memory circuit shown in FIG. 1.

FIG. 2 shows a buffer circuit which is used to constitute each of the address buffer circuits AB1 to AB8. It has a first series circuit connected between voltage supply terminals Vc and Vs and including MOS transistors 21 to 23, a second series circuit of MOS transistors 24 to 26, a third series circuit of MOS transistors 27 to 29, a fourth series circuit of MOS transistors 30 to 32 and a fifth series circuit of MOS transistors 33 to 35. The gate and source of the MOS transistor 22 are connected to the gate of the MOS transistor 26, the gate and source of the MOS transistor 25 are connected to the gates of the MOS transistors 29, 31 and 35, and the gate and source of the MOS transistor 28 are connected to the gates of the MOS transistors 32 and 34.

The MOS transistors 21, 24, 27, 30 and 33 receive the power-down signal PD at the gates and have a threshold voltage of substantially 0 V, and hereinafter they are referred to as I type MOS transistor. An address signal Ai (i being 1 to 8) is supplied to the gate of the MOS transistor 23. The buffer circuit further has a MOS transistor 36, which is connected in parallel with the MOS transistor 32 and receives the power-down signal $\overline{PD}$ at its gate and a MOS transistor 37, which is connected in parallel with the MOS transistor 35 and receives the power-down signal $\overline{PD}$ at its gate.

Figure 3:
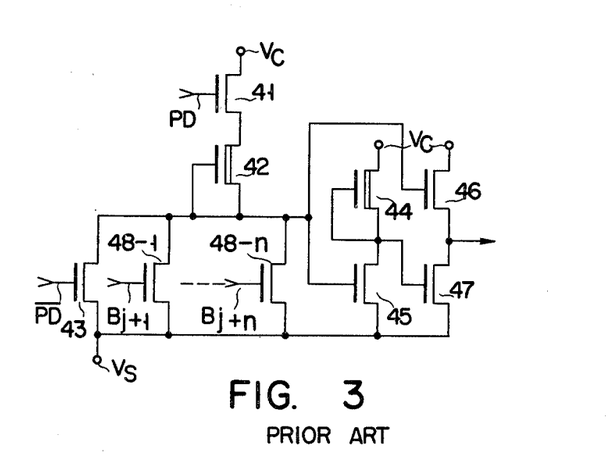
FIG. 3 is a circuit diagram of a decoder unit used for forming the decoder circuits in the semicondutor memory circuit shown in FIG. 1.

FIG. 3 shows a decoder unit which is used for forming the row and column decoders RD and CD shown in FIG. 1. It has a first series circuit connected between voltage supply terminals Vc and Vs and including MOS transistors 41 to 43, a second series circuit of MOS transistors 44 and 45 and a third series circuit of MOS transistors 46 and 47. The gate and source of the MOS transistor 42 are connected to the gates of the MOS transistors 45 and 46, and the gate and source of the MOS transistor 44 are connected to the gate of the MOS transistor 47. Where this decoder unit is used for forming the row decoder, the junction between the MOS transistors 46 and 47 is connected to one of the word lines WL1 to WL64.

The decoder unit further includes a plurality of MOS transistors 48-1 to 48-n connected in parallel with the MOS transistor 43 and each having the gate connected to the output terminal of corresponding one of the address buffer circuits AB1 to AB8. The power-down signals PD and $\overline{PD}$ are supplied to the gates of the respective MOS transistors 41 and 43. The MOS transistors 41 and 46 are I type MOS transistors.

The row decoder RD is constructed with sixty-four decoder units, which have the same construction as the decoder unit shown in FIG. 3 and selectively produce word line selection signals according to the output signals from the address buffer circuits AB1 to AB6, and the column decoder CD is constructed with four decoder units, which have the same construction as the decoder unit of FIG. 3 and selectively produce column line selection signals in response to the output signals from the address buffer circuits AB7 and AB8.

In the semiconductor memory device shown in FIGS. 1 to 3, when the power-down signal generator PDG produces power-down signals of PD of "1" and $\overline{PD}$ of "0" in response to a chip enable signal of "1" generated from an external circuit (not shown), the MOS transistors 21, 24, 27, 30, 33 and 41 shown in FIGS. 2 and 3 are rendered conductive. As a result, the buffer circuit shown in FIG. 2 produces output signals Bi and $\overline{Bi}$ corresponding to the address signal Ai, and the decoder unit shown in FIG. 3 produces an output signal corresponding to one of the buffer output signals Bj+1 to Bj+n. More particularly, the row decoder RD selectively energizes one of the word lines WL1 to WL64 according to the address signals A1 to A6, while the column decoder CD selectively energizes one of the four output lines according to the address signals A7 and A8. In this way, a memory cell is selected for read/write operation.

When the power-down signal generator PDG in the semiconductor memory circuit shown in FIGS. 1 to 3 produces power-down signals PD of "0" and $\overline{PD}$ of "1" in response to a chip enable signal of "0" or chip disable signal generated from the external circuit, the MOS transistors 21, 24, 27, 30, 33, 41 and 46 are rendered nonconductive, and the drain voltage of the MOS transistors 36, 37 and 43 is changed to a low level irrespective of the address signals Ai and Bj+1 to Bj+n. As a result, the address buffer circuits AB1 to AB8 and row and column decoders RD and CD are set to a power-down state, in which leak current flows only through the I type MOS transistors.

While the semiconductor memory circuit of FIG. 1 is held in the power-down state, it consumes little power so long as the chip disable signal prevails as the input to the power-down signal generator PDG. Its power consumption is substantially increased in case when it effects high speed operation in its operative or enable state, which is brought about when the chip enable is signal supplied to the power-down signal generator PDG. Particularly, in a high density memory the power consumption in the row and column decoders RD and CD occupies a great proportion of the total power consumption of the chip. Thus, it is very important to reduce power consumption in the row and column decoders.

The object of the invention is to provide a semiconductor memory circuit, which has a function of reducing the power consumption not only at the time of the chip disable mode but also at the time of the chip enable mode.

According to one form of the invention, there is provided a semiconductor memory circuit comprising a semiconductor memory means including a plurality of memory areas each having a plurality of semiconductor memory cells, a plurality of data lines coupled to the memory cells in the plurality of memory areas to permit transfer of data to and from the individual memory cells, a plurality of word lines connected to the memory cells in the plurality of memory areas to permit transfer of access signals to the memory cells, a decoding means including a plurality of decoding sections connected to the data lines and word lines to supply selection signals to the memory cells in the respective memory areas and switching sections connected to the respective decoding sections, and a power-down state setting means connected to the switching sections for controlling the conduction state thereof to selectively set the decoding sections to a power-down state.

This invention can be more fully understood from the following detailed description when taken in conjunction with the accompanying drawings, in which.

Figure 4:
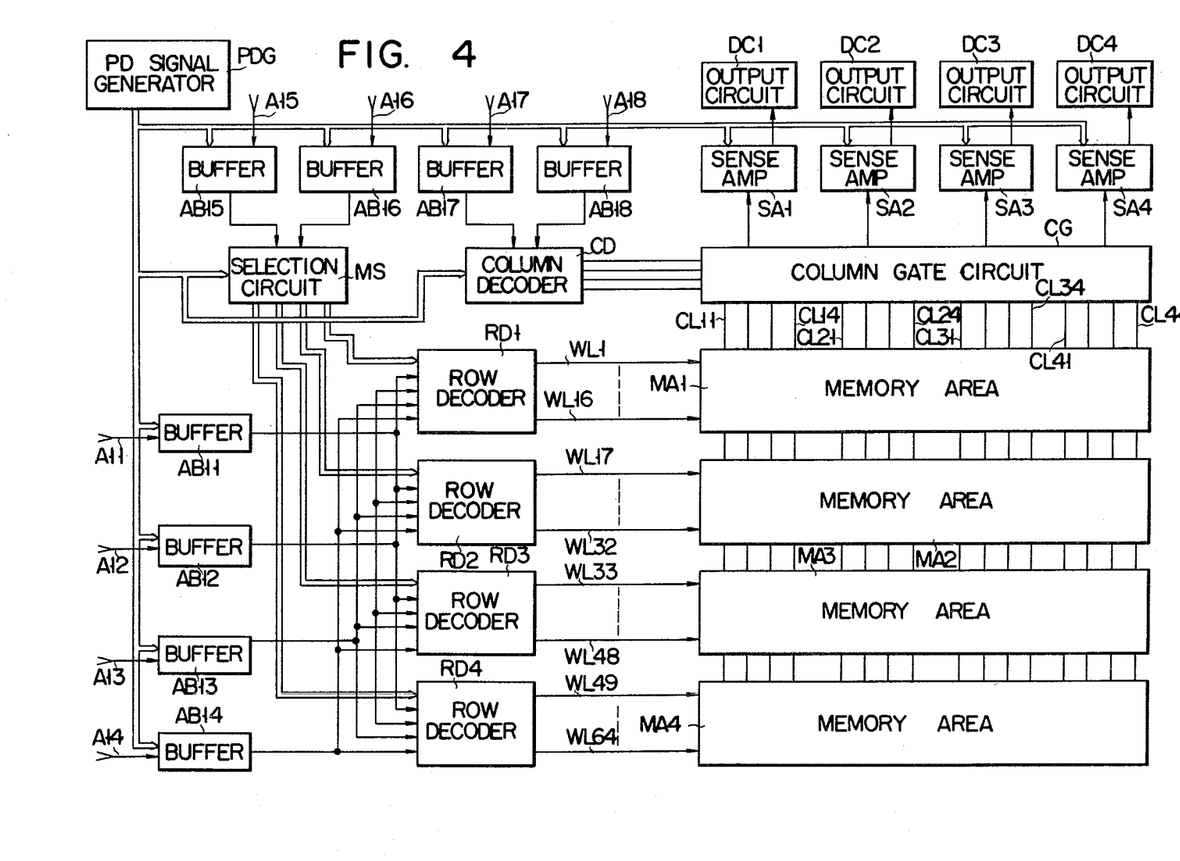
FIG. 4 is a block diagram showing an embodiment of the semiconductor memory circuit according to the invention.

FIG. 4 shows an embodiment of the semiconductor memory circuit according to the invention. This semiconductor memory circuit includes four memory areas MA1 to MA4, row decoders RD1 to RD4 for supplying row selection signals to the respective memory areas MA1 to MA4, a memory selection circuit MS selectively activating one of the memory areas MA1 to MA4 by supplying a selection signal to a corresponding one of the row decoders RD1 to RD4, a column gate circuit CG and a column decoder CD for supplying a column selection signal through the column gate circuit CG to the memory areas MA1 to MA4. It further includes address buffer circuits AB11 to AB14 each adapted to supply an output signal to the row decoders RD1 to RD4 in response to a corresponding one of row address signals A11 to A14 from an address signal generator (not shown), address buffer circuits AB15 and AB16 for supplying respective output signals to the memory selection circuit MS in response to corresponding address signals A15 and A16, and address buffer circuits AB17 and AB18 for supplying respective output signals to the column decoder CD in response to corresponding address signals A17 and A18. The column gate circuit CG has the same construction as the column gate circuit shown in FIG. 1, is formed of a plurality of MOS transistors, and it selectively couples data lines or column lines CL11 to CL44 to the sense amplifiers SA1 to SA4 according to the output signal from the column decoder CD.

Each of the memory areas MA1 to MA4 of this semiconductor memory circuit has a plurality of semiconductor memory cells, for instance constituted by MOS transistors, arranged in a matrix array as is well known in the art. The memory area MA1 is connected through word lines WL1 to WL16 to the row decoder RD1, the memory area MA2 is connected through word lines WL17 to WL32 to the row decoder RD2, the memory area MA3 is connected through word lines WL33 to WL48 to the row decoder RD3, and the memory area MA4 is connected through word lines WL49 to WL64 to the row decoder RD4. On the other hand, the sense amplifiers SA1 to SA4 are connected to a data processing circuit (not shown) through data output circuits DC1 to DC4.

A power-down signal generator PDG supplies power-down signals PD and $\overline{PD}$ in inverted relationship to the address buffer circuits AB11 to AB18, memory selection circuit MS, column decoder CD and sense amplifiers SA1 to SA4 according to a chip enable or disable signal from an external control circuit (not shown).

The address buffer circuits AB11 to AB18 are each constituted by the buffer circuit shown in FIG. 2, and the column decoder CD is constituted by four decoder units individually having the same construction as the decoder unit shown in FIG. 3. Thus, the address buffer circuits AB11 to AB18 and column decoder CD can effect normal operation so long as the chip enable signal prevails as the input to the power-down signal generator PDG and is set in a power-down state when the power-down signal generator PDG receives the chip disable signal.

Figure 5:
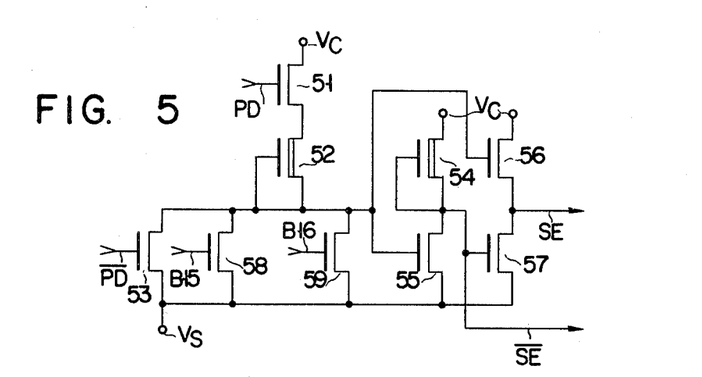
FIG. 5 is a circuit diagram of a memory selection circuit in the semiconductor memory circuit of FIG. 4.

FIG. 5 shows a selection unit which is used to form the memory selection circuit MS. It has a first series circuit connected between voltage supply terminals Vc and Vs and including MOS transistors 51, 52 and 53, a second series circuit including MOS transistors 54 and 55 and a third series circuit including MOS transistors 56 and 57. The gate and source of the MOS transistor 52 are connected to the gates of the MOS transistors 55 and 56. The selection unit further includes MOS transistors 58 and 59, which are connected in parallel with the MOS transistor 53 and have their gates connected to the output terminals of the respective buffer circuits AB15 and AB16 for receiving the buffer output signals B15 or $\overline{B15}$ or B16 or $\overline{B16}$ (in FIG. 5 the buffer output signals B15 and B16 are shown as an example). This unit produces output signals SE and $\overline{SE}$ in inverted relationship, the former being derived from the junction between the MOS transistors 56 and 57 and the latter from the junction between the MOS transistors 54 and 55.

The memory selection circuit MS includes four selection units individually having the same construction as the selection unit shown in FIG. 5 and adapted to receive respectively different combinations of buffer output signals B15 or $\overline{B15}$ and B16 or $\overline{B16}$.

When the power-down signal generator PDG produces power-down signals PD of "1" and $\overline{PD}$ of "0" upon receipt of the chip enable signal, the I type MOS transistor 51 and MOS transistor 53 are respectively rendered conductive and nonconductive. Thus, the logic values of the output signals SE and $\overline{SE}$ are determined by the buffer output signals supplied to the gates of the MOS transistors 58 and 59. When the power-down signal generator PDG produces power-down signals PD of "0" and $\overline{PD}$ of "1" upon receipt of the chip disable signal, the I type MOS transistor 51 and MOS transistor 53 are respectively rendered nonconductive and conductive, so that the selection unit is set to the power-down state. In that event, predetermined logic values, for instance "0" and "1", are provided as the output signals SE and $\overline{SE}$ irrespective of the buffer output signals supplied to the gates of the MOS transistors 58 and 59.

Figure 6:
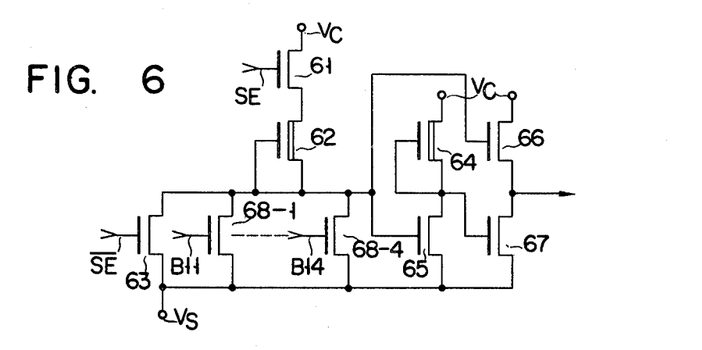
FIG. 6 is a circuit diagram of a decoder unit used to form a row decoder in the semiconductor memory circuit of FIG. 4.

FIG. 6 shows a decoder unit which is used to form each of the row decoders RD1 to RD4. It has a first series circuit connected between voltage supply terminals Vc and Vs and including MOS transistors 61 to 63, a second series circuit of MOS transistors 64 and 65 and a third series circuit of MOS transistors 66 and 67. The gate and source of the MOS transistor 62 are connected to the gates of the MOS transistors 65 and 66. The decoder unit further includes MOS transistors 68-1 to 68-4, which are connected in parallel with the MOS transistor 63 and have their gates connected to the output terminals of the respective address buffer circuits AB11 to AB14 for receiving the buffer output signals B11 or $\overline{B11}$ to B14 or $\overline{B14}$.

In each of the decoder units which are used to form the row decoder RD1, the I type MOS transistor 61 and MOS transistor 63 are adapted to receive at their gates the respective output signals SE and $\overline{SE}$ of the corresponding one of the four selection units of the memory selection circuit MS, and the junction between the MOS transistors 66 and 67 of this decoder unit is connected to one of the word lines WL1 to WL16. Likewise, each of the decoder units used for the other row decoders RD2 to RD4 is connected to a corresponding one of the other selection units and to one of the word lines in a corresponding one of the other word line groups including word lines WL17 to WL32, WL33 to WL48 and WL49 to WL64.

As has been mentioned earlier, when the power-down signal generator PDG produces power-down signals PD of "0" and $\overline{PD}$ of "1" upon receipt of the chip disable signal from the external control circuit, the address buffer circuits AB11 to AB18, column decoder CD, sense amplifiers SA1 to SA4 and memory selection circuit MS are set to the power-down state. In this case, each of the four selection units of the memory selection circuit MS produces output signals SE of "0" and $\overline{SE}$ of "1", and the MOS transistors 61 and 63 in each of the decoder units of the row decoders RD1 to RD4 are respectively rendered conductive and nonconductive. Thus, all of the row decoders RD1 to RD4 are set to the power-down state, and the output signals of all of the decoder units are rendered to be at a low level, that is, no word line is energized.

When the power-down signal generator PDG produces power-down signals PD of "1" and $\overline{PD}$ of "0" upon receipt of the chip enable signal, one of the four selection units of the memory selection circuit MS is selected according to a corresponding combination of the output signals B15 or $\overline{B15}$ and B16 or $\overline{B16}$ of the address buffer circuits AB15 and AB16. At this time the non-selected selection units each produce output signals SE of "0" and $\overline{SE}$ of "1". Thus, the MOS transistors 61 and 63 of each decoder unit of the row decoders connected to the non-selected selection units are respectively rendered nonconductive and conductive. This means that the row decoders connected to the non-selected selection units are set to the power-down state. Meanwhile, the MOS transistors 61 and 63 in each of the decoder units of one of the row decoders RD1 to RD4 that is connected to the selected selection unit are respectively rendered conductive and nonconductive. The signal level of the output signals of these decoder units is determined according to the combination of the buffer output signals B11 or $\overline{B11}$ to B14 or $\overline{B14}$, and the output signal of one of the decoder units is changed to a high level, that is, one of the word lines WL1 to WL64 is energized.

As has been shown, in this embodiment, in addition to the fact that predetermined circuits are set to the power-down state in the chip disable mode, in the chip enable mode three of the four row decoders RD1 to RD4 are selectively set to the power-down state, thus reducing the total power consumption.

Figure 7:
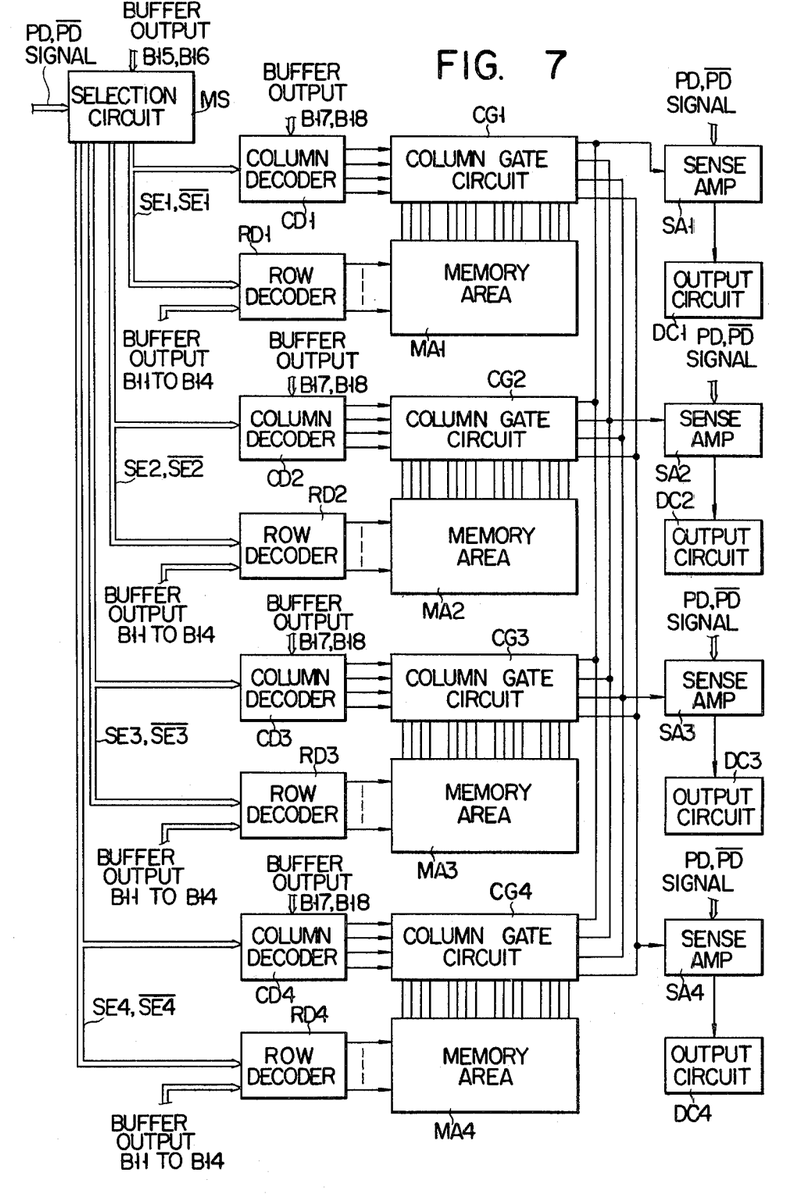
FIG. 7 is a block diagram showing part of a different embodiment of the semiconductor memory circuit according to the invention.

FIG. 7 shows part of a different embodiment of the semiconductor memory device according to the invention. This semiconductor memory circuit is the same as the preceding embodiment of FIG. 4 except that in this case memory areas MA1 to MA4 are separated from one another, that four column gate circuits CG1 to CG4 are connected to the respective memory areas and that column decoders CD1 to CD4 are connected to the respective column gate circuits CG1 to CG4. In this embodiment, the column decoders CD1 to CD4, like row decoders RD1 to RD4, are controlled by selection signals SE1 and $\overline{SE1}$ to SE4 and $\overline{SE4}$ from memory selection circuit MS.

Figure 8:
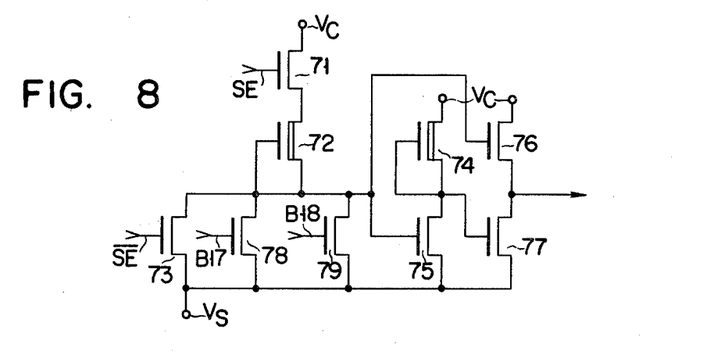
FIG. 8 is a circuit diagram of a decoder unit used to form a column decoder in the semiconductor memory circuit in FIG. 7.

FIG. 8 shows a decoder unit which is used to form each of the column decoders CD1 to CD4 shown in FIG. 7. It has substantially the same construction as the decoder unit shown in FIG. 6. More particularly, MOS transistors 71 to 77 are connected in the same way as the MOS transistors 61 to 67. MOS transistors 78 and 79 which are connected in parallel with the MOS transistor 73 receive at their gate output signals B17 or $\overline{B17}$ and B18 or $\overline{B18}$ of address buffer circuits AB17 and AB18. In this embodiment, each of the column decoders CD1 to CD4 is formed with four decoder units, which have substantially the same construction as the decoder unit shown in FIG. 8, and one of its four output lines is selectively energized according to the output signals from the buffer circuits AB17 and AB18.

As has been mentioned, in the chip disable mode the memory selection circuit MS provides output signals SE1 to SE4 of "0" and $\overline{SE1}$ to $\overline{SE4}$ of "1". Thus, the I type MOS transistor 71 and MOS transistor 73 in the decoder unit of FIG. 8 are respectively rendered nonconductive and conductive, and all the column decoders CD1 to CD4 are set to the power-down state. Of course, in this case the output signals of all the column decoders are at the low level, and no data or column line is energized.

In the chip enable mode, of the four sets of selection signals SE1 and $\overline{SE1}$ to SE4 and $\overline{SE4}$, a given set of signals, for instance, signals SE1 and $\overline{SE1}$ are respectively "1" and "0", while the signals in the other sets are respectively "0" and "1". Thus, in this case the column decoders CD2 to CD4 are set to the power-down state, while the column decoder CD1 is set to the operative state, and data is read out from the memory area MA1 according to column and row selection signals from the column and row decoders CD1 and RD1.

With this embodiment, when applied to a memory having a large number of word lines, the operation speed can be improved compared to the case of the semiconductor memory circuit shown in FIG. 4.

Figure 9:
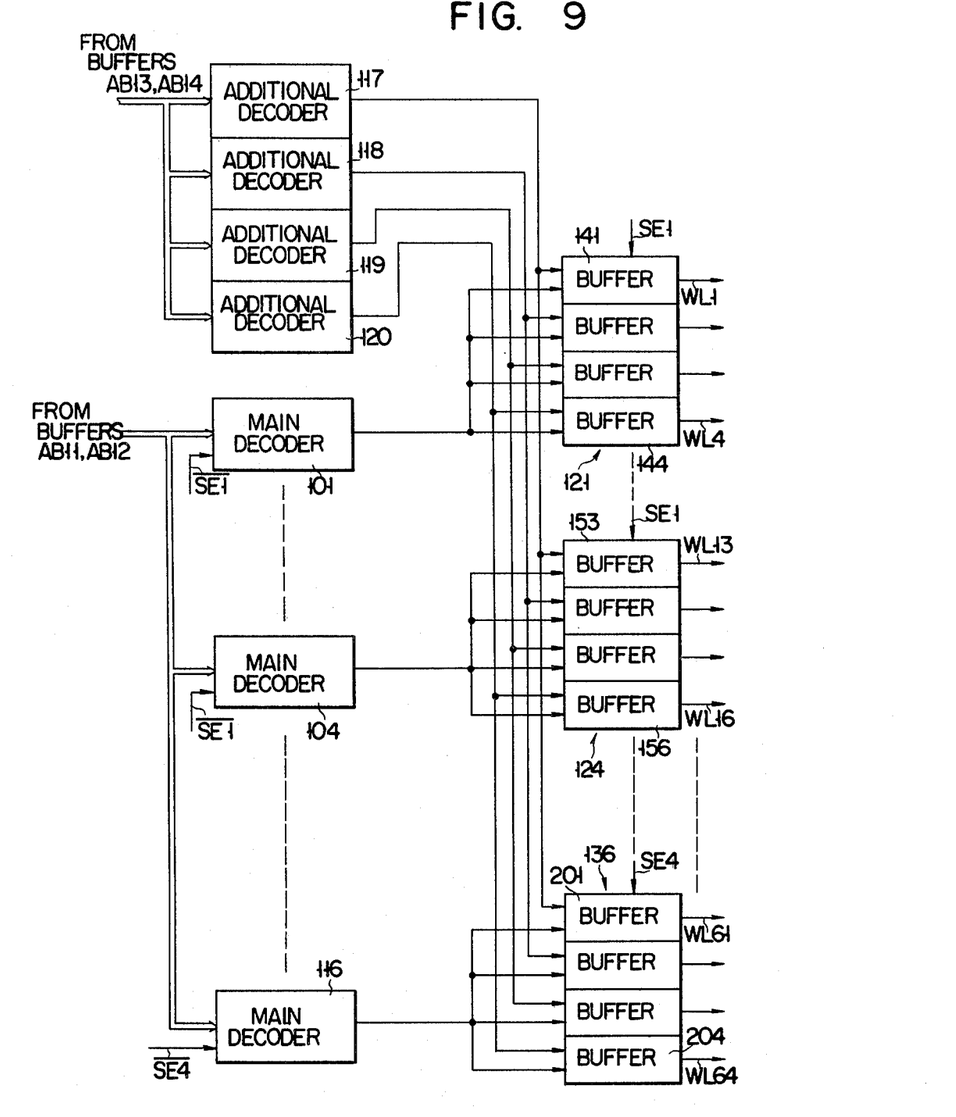
FIG. 9 is a block diagram schematically showing row decoders in the semiconductor memory circuit of FIG. 4.

FIG. 9 is a detailed block diagram showing the row decoders RD1 to RD4 in the embodiment of FIG. 4. As is shown, the row decoders RD1 to RD4 include sixteen main decoders 101 to 116, which receive as input signals the buffer output signals B11, $\overline{B11}$ and B12, $\overline{B12}$ from the address buffers AB11 and AB12 and which produce output signals corresponding to the respective input signals. RD1-RD4 also comprise four additional decoders 117 to 120, which receive as input signals the output signals B13, $\overline{B13}$ and B14 and $\overline{B14}$ from the address buffers AB13 and AB14 and which produce output signals corresponding to the respective input signals, and sixteen buffer circuits 121 to 136 connected to the output terminals of the respective main decoders 101 to 116. The buffer circuits 121 to 136 individually include four buffers 141 to 144, 145 to 148, ... and 201 to 204. The buffers in each buffer circuit each have a first input terminal connected to a corresponding one of the main decoders 101 to 116 and a second input terminal connected to a corresponding one of the additional decoders 117 to 120. These buffers 141 to 204 have their output terminals connected to the respective word lines WL1 to WL64.

It will be understood from FIG. 9 that each of the row decoders RD1 to RD4 includes four of the sixteen main decoders 101 to 116, sixteen of the sixty-four buffers 141 to 204, and the additional decoders 117 to 120 commonly used for all the row decoders RD1 to RD4. For example, the row decoder RD1 comprises the main decoders 101 to 104, buffer circuits 121 to 124 including the buffers 141 to 156 and additional decoders 117 to 120.

Figure 10:
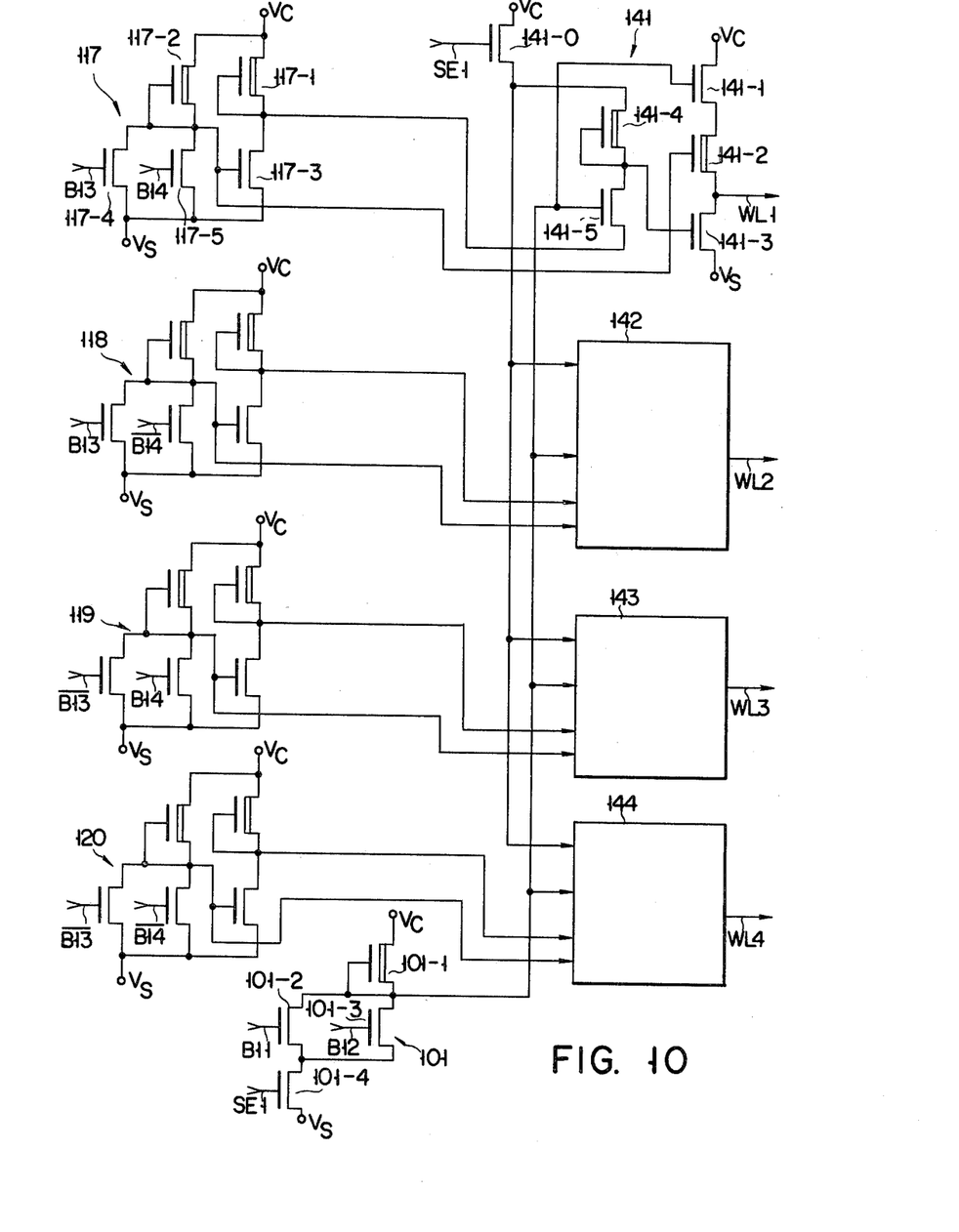
FIG. 10 is a circuit diagram of part of the row decoders shown in FIG. 9.

FIG. 10 is a circuit diagram showing the detailed circuit construction of the main decoder 101, buffer circuit 121, including the buffers 141 to 144, and additional decoders 117 to 120, these parts constituting the row decoder RD1 in the semiconductor memory circuit of FIG. 7. The main decoder 101 has a depletion type (D type) MOS transistor 101-1, whose drain is connected to the voltage supply, terminal Vc and whose source is connected to the gate to form resistive means and MOS transistors 101-2 to 101-4. The MOS transistors 101-2 and 101-3 are connected between the source of the D type MOS transistor 101-1 and the drain of the MOS transistor 101-4, which has its source connected to the voltage supply terminal Vs. The buffer output signals B11 and B12 from the respective address buffers AB11 and AB12 are applied to the gates of the respective MOS transistors 101-2 and 101-3, and the selection signal SE1 is supplied to the gate of the MOS transistor 101-4.

The additional decoder 117 has D type MOS transistors 117-1 and 117-2 each having its drain connected to the voltage supply terminal Vc and its source connected to its gate to form resistive means, a MOS transistor 117-3 acting as an inverter having its current path connected between the D type MOS transistor 117-1 and the voltage supply terminal Vs and its gate connected to the source of the D type MOS transistor 117-2, and MOS transistors 117-4 and 117-5 connected between the source of the D type MOS transistor 117-2 and the voltage supply terminal Vs. The buffer output signals B13 and B14 from the address buffers AB13 and AB14 are applied to the gates of the respective MOS transistors 117-4 and 117-5.

The other additional decoders 118 to 120 have the same construction as the additional decoder 117, and in these additional decoders the buffer output signals B13 and $\overline{B14}$, $\overline{B13}$ and B14 and $\overline{B13}$ and $\overline{B14}$ are similarly coupled to the gates of the MOS transistors corresponding to the respective MOS transistors 117-4 and 117-5.

The buffer 141 has MOS transistors 141-1 to 141-3 having their current paths connected in series between the voltage supply terminals Vc and Vs, and MOS transistors 141-4 and 141-5 having their current paths connected between the source of an MOS transistor 141-0, which has its drain connected to the voltage supply terminal Vc and receives at its gate the selection signal SE1. The source of the MOS transistor 117-1 of the additional decoder 117 is connected to the source of MOS transistor 141-5.

The MOS transistors 141-2 and 141-4 are D type MOS transistors. The gates of the MOS transistors 141-1 and 141-5 are connected to the source of the MOS transistor 101-1 of the main decoder 101, the gate of the MOS transistor 141-2 is connected to the source of the MOS transistor 117-2 of the additional decoder 117, and the gate of the MOS transistor 141-3 is connected to the gate of the MOS transistor 141-4, the gate and source of MOS transistor 141-4 being connected together to form resistive means. The other buffers 142 to 144 have the same construction as the buffer 141. Of course, these buffers 142 to 144 are connected to the respective additional decoders 118 to 120 and are connected to the MOS transistor 141-0 and main decoder 101 in the same way as the buffer 141.

The other three of the four main decoders 101 to 104 are constructed to be sensitive to the respective output signals B11 and $\overline{B12}$, $\overline{B11}$ and B12, and B12, and $\overline{B11}$ and $\overline{B12}$ of the address buffer circuits AB11 and AB12. The source of the MOS transistor 141-0 is commonly connected to the sixteen buffers 141 to 156 which are connected to the main decoders 101 to 104. This means that the buffers 141 to 156 are set to their active or operative state when the selection signal SE1 of "1" is produced from the selection circuit MS (shown in FIG. 7).

Now, assume that buffer output signals B11 to B14 of "0" are produced from the respective address buffer circuits AB11 to AB14 and selection signal SE1 of "1" from the memory selection circuit MS. In this case, the MOS transistors 101-2 and 101-3 of the main decoder 101 are rendered nonconductive while the MOS transistor 101-4 is rendered conductive, so that a "1" output signal is produced from the main decoder 101. Thus, the MOS transistors 141-1 and 141-5 and the corresponding MOS transistors in the other buffers 142 to 144 are rendered conductive.

Also, the MOS transistors 117-4 and 117-5 in the additional decoder 117 are both rendered nonconductive, thus rendering the source potentials of the MOS transistors 171-1 and 171-2 to be at "0" and "1" levels respectively. As a result, the MOS transistor 141-2 is rendered conductive while the source potential on the MOS transistor 141-4 is brought to a low level, so that the MOS transistor 141-3 is rendered nonconductive. Thus, the word line WL1 is energized. Meanwhile, in the other buffers 142 to 144 than the buffer 141 to the MOS transistors corresponding to the MOS transistor 141-3 are rendered conductive, while the MOS transistors corresponding to the MOS transistor 141-2 are rendered nonconductive, so that the word lines WL2 to WL4 are not energized.

Further, in the other three of the four main decoders 101 to 104, the MOS transistors corresponding to the MOS transistors 141-1 and 141-5 are rendered nonconductive while those corresponding to the MOS transistor 141-3 are rendered conductive. Thus, the word lines WL5 to WL16 are also not energized.

Further, the buffers other than the buffers 141 to 156 and the main decoders other than the main decoders 101 to 104 are set to the power-down state MOS transistors corresponding to the MOS transistors 141-0 and 101-4 are rendered nonconductive. At this time, the output levels of the word lines WL17 to WL64 are all rendered to be "1". In this case, no problem arises if the output levels of the column decoders CD2 to CD4 are all rendered to be "0" at this time. This is because the individual memory areas are independent of one another.

Alternatively, the output levels of the word lines in the power-down state may be rendered to the low level by connecting MOS transistors, which receive the selection signal $\overline{SE}$ at their gate, respectively, in parallel with the MOS transistor 141-3 and corresponding MOS transistors in the respective buffers and also connecting MOS transistors, which receive the selection signal SE at their gate, respectively, between the drains of the MOS transistor 141-1 and corresponding MOS transistors and the voltage supply terminal Vc. This alternative arrangement of the row decoders can be used for the semiconductor memory circuit of FIG. 4 as well.

Figure 11:
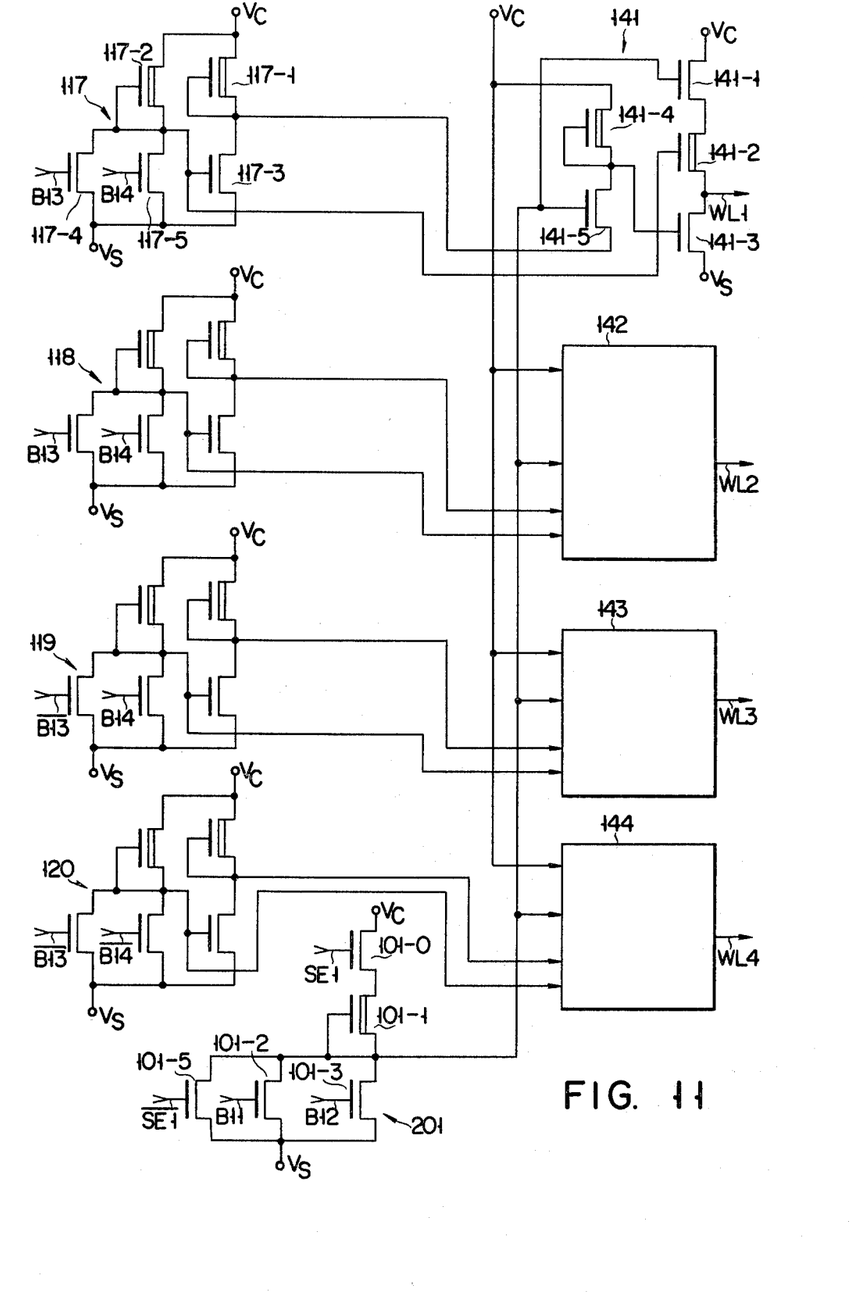
FIG. 11 is a circuit diagram showing a modification of the row decoder circuit shown in FIG. 10.

FIG. 11 shows a modification of the circuit shown in FIG. 10. This circuit is the same as the circuit of FIG. 10 except that the MOS transistor 141-0 shown in FIG. 10 is omitted and that a main decoder 201 is formed in such a manner that the MOS transistor 101-4 in the main decoder 101 shown in FIG. 10 is omitted, a MOS transistor 101-0, which receives the selection signal SE1 at its gate, is connected between the drain of the MOS transistor 101-1 and voltage supply terminal Vc, and a MOS transistor 101-5, which receives the selection signal $\overline{SE1}$ at its gate, is connected in parallel with MOS transistors 101-2 and 101-3. The circuit of FIG. 11 may be used for the semiconductor memory circuit of FIG. 4 or 7. In this case, the output signals on all the word lines in the power-down state are "0".

Figure 12:
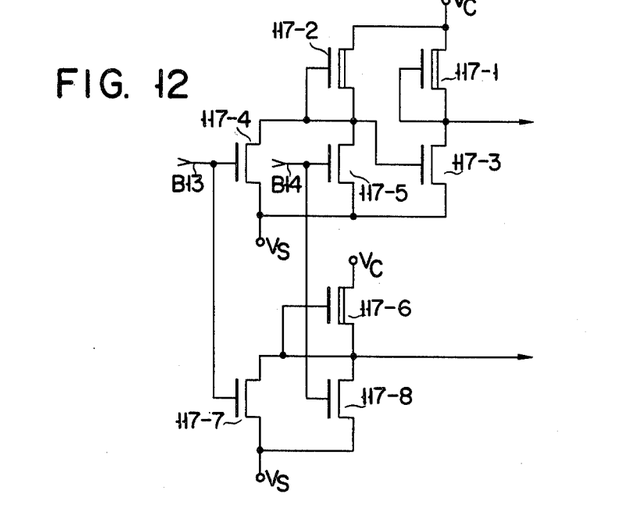
FIG. 12 is a circuit diagram showing a modification of an additional decoder in the row decoder circuit shown in FIG. 10.

FIG. 12 shows a modification of the additional decoder 117 shown in FIG. 11. This modification additionally includes a D type MOS transistor 117-6 having the gate and source connected to each other and MOS transistors 117-7 and 117-8 connected between the source of the MOS transistor 117-6 and voltage supply terminal Vs. The output signals B13 and B14 of the address buffer circuits AB13 and AB14 are also supplied to the gates of the respective MOS transistors 117-7 and 117-8. In this additional decoder 117, one of the two output signals is derived not from the junction between the MOS transistors 117-2 and 117-5 but from the junction between the MOS transistors 117-6 and 117-8. Thus, it is possible to set the operation speed of the circuit constituted by the MOS transistors 117-1 to 117-5 independently of the circuit constituted by the MOS transistors 117-6 to 117-8.

Figure 13:
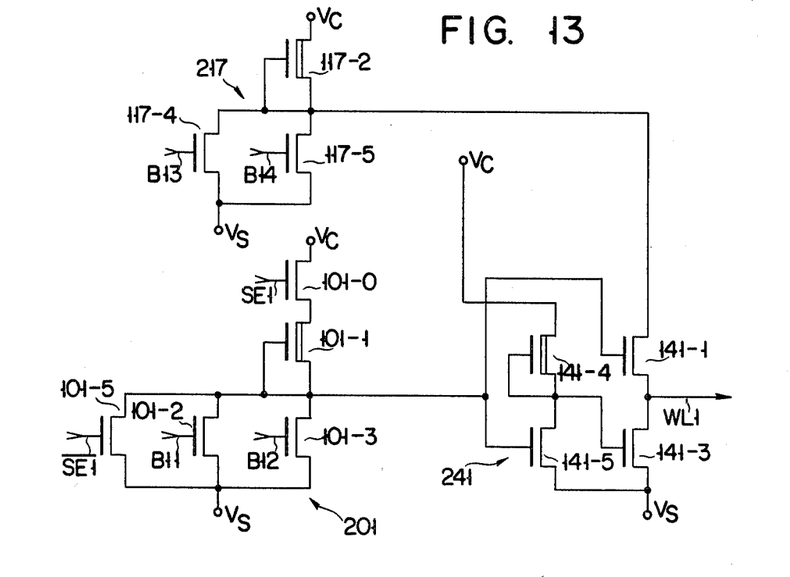
FIG. 13 is a circuit diagram showing a main decoder, an additional decoder and a buffer in the row decoder circuit shown in FIG. 10.

FIG. 13 shows a modification of the circuit including the main decoder 101, additional decoder 117 and buffer 141 shown in FIG. 11. Here, the main decoder 201 has the same construction as the main decoder 101 of FIG. 11 and includes MOS transistors 101-0 to 101-3 and 101-5, the additional decoder 217 includes MOS transistors 117-2, 117-4 and 117-5. The MOS transistors 117-1 and 117-3 in the additional decoder of FIG. 11 is omitted here. The buffer 241 includes MOS transistors 141-1 and 141-3 to 141-5, the MOS transistor 141-2 in the buffer 141 of FIG. 11 being omitted here. In this circuit, the drain of the MOS transistor 141-1 of the buffer 241 is connected not to the voltage supply terminal Vc but to the output terminal of the additional decoder 217, i.e., to the junction between the MOS transistors 117-2 and 117-5, and the source of the MOS transistor 141-5 is connected to the voltage supply terminal Vs.

It is to be understood that the main decoder 201 shown in FIG. 13 may be used as each of the main decoders 101 to 116 shown in FIG. 9, the additional decoder 217 as each of the additional decoders 117 to 120 and the buffer 241 as each of the buffers 141 to 204.

In the circuit of FIG. 13, when buffer output signals of "0" are produced from the address buffer circuits AB11 to AB14 and a selection signal SE1 of "1" is produced from the memory selection circuit MS, the MOS transistors 101-2, 101-3 and 101-5 are rendered nonconductive, so that a high level output is produced from the main decoder 201 to render the MOS transistors 141-1 and 141-5 conductive. As a result, the MOS transistor 141-3 is rendered nonconductive. Meanwhile, the MOS transistors 117-4 and 117-5 are both rendered nonconductive, so that a high level signal is produced from the additional decoder 217. Thus, the word line WL1 is energized through the MOS transistor 141-1. If at least one of the buffer output signals B11 to B14 is "1" at this time, the word line WL1 is not energized.

In the circuit shown in FIG. 13, the additional decoder 217 is required to be provided with only a single output line, so that it is possible to simplify the manufacturing process and increase the integration density compared to the circuit shown in FIG. 10.

Figure 14:
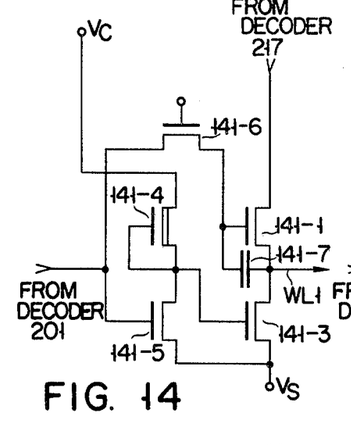
FIGS. 14 and 15 are circuit diagrams showing modifications of the buffer shown in FIG. 13.

FIG. 14 shows a modification of the buffer 241 shown in FIG. 13. It has the same construction as the buffer circuit shown in FIG. 13 except that the output line of the main decoder 201 is connected to the gate of the MOS transistor 141-1 not directly but through an I type MOS transistor 141-6 having the gate connected to the voltage supply terminal Vc. A coupling capacitor 141-7 is also connected between the gate and source of the MOS transistor 141-1.

In the buffer shown in FIG. 14, when the word line WL1 is selected so that its potential is changed from "0" level to "1" level, the gate voltage on the MOS transistor 141-1 is set to a higher voltage level than the voltage at the voltage supply terminal Vc by a bootstrap action of the coupling capacitor 141-7. As a result, the source potential on the MOS transistor 141-1 becomes equal to the voltage Vc, and the word line WL1 is energized. At this time, the MOS transistor 141-6 is rendered nonconductive since its threshold value is substantially 0 V. Thus, even if the gate voltage on the MOS transistor 141-1 becomes sufficiently high, it has no influence upon the other circuits at all.

Figure 15:
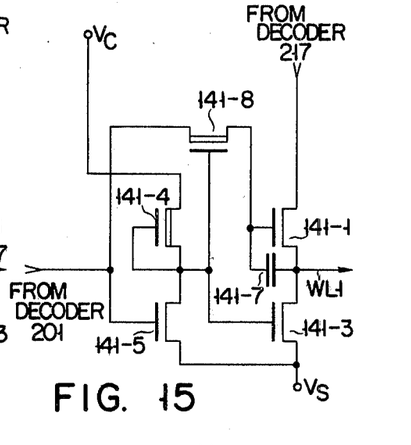

FIG. 15 shows another modification of the buffer 241 shown in FIG. 13. It has substantially the same construction as the buffer 241 shown in FIG. 14 except that it uses a D type MOS transistor 141-8 with the gate connected to the junction between the MOS transistors 141-4 and 141-5 instead of the MOS transistor 141-6 shown in FIG. 14.

When the buffer shown in FIG. 15 is selected, that is, when a high level output signal is produced from the main decoder 201, the MOS transistor 141-5 is rendered conductive, so that the source voltage on the MOS transistor 141-4 and the gate voltage on the MOS transistor 141-8 are reduced substantially to 0 V. Thus, with the gate voltage on the MOS transistor 141-1 increased to be higher than the voltage Vc due to the bootstrap action of the coupling capacitor 141-7, the MOS transistor 141-8 is rendered perfectly nonconductive. Thus, the gate voltage on the MOS transistor 141-1 is held at a sufficiently high value.

Figure 16:
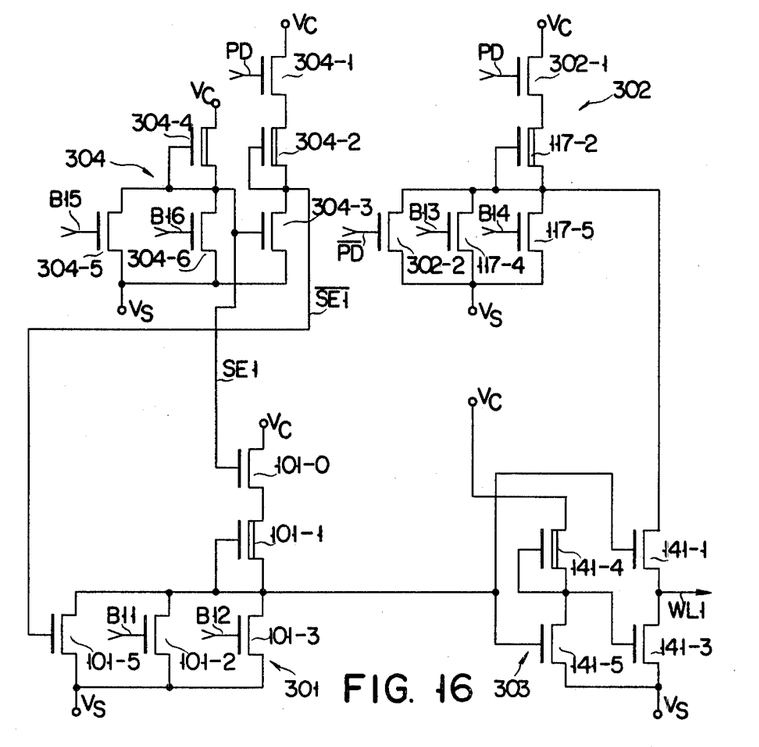
FIG. 16 is a circuit diagram showing a main decoder, an additional decoder, a buffer and a selection unit used in the embodiment of FIGS. 4 and 9.

FIG. 16 shows a circuit diagram of a main decoder 301, an additional decoder 302, a buffer 303 and a selection unit 304, which may, be used for the semiconductor memory circuit of FIGS. 4 or 7. The main decoder 301 has the same construction as the main decoder 201 shown in FIG. 13, the additional decoder 302 has the same construction as the additional decoder 217 shown in FIG. 13 except that it additionally includes an I type MOS transistor 302-1 connected between the drain of the MOS transistor 117-2 and voltage supply terminal Vc and a MOS transistor 302-2 connected between the source of the MOS transistor 117-2 and voltage supply terminal Vc, and the buffer 303 has the same construction as the buffer 241 shown in FIG. 13.

The selection unit 304 is a modification of the selection unit shown in FIG. 5. It has a series circuit connected between the voltage supply terminals and includes MOS transistors 304-1 to 304-3, a D type MOS transistor 304-4, whose drain is connected to the voltage supply terminal Vc and whose source is connected to the gate, and MOS transistors 304-5 and 304-6 connected between the source of the MOS transistor 304-4 and voltage supply terminal Vs. The MOS transistor 304-1 is an I type MOS transistor receiving the power-down signal PD at its gate, and the MOS transistor 304-2 is a D type MOS transistor having the gate and drain connected to each other. The MOS transistors 304-5 and 304-6 receive the respective address buffer signals B15 and B16 at their gates. This selection unit 304 produces selection signals SE1 and $\overline{SE1}$ according to the address buffer signals B15 and B16.

In the circuit of FIG. 16, when the buffer output signals B11 to B16 from the address buffer circuits AB11 to AB16 are all "0", the MOS transistors 304-5 and 304-6 are rendered nonconductive, so that the selection unit 304 produces selection signals SE1 of "1" and $\overline{SE1}$ of "0". As a result, the MOS transistor 101-0 is rendered conductive while the MOS transistor 101-5 is rendered nonconductive. As a result, a high level output signal is produced from the main decoder 301 to render conductive the MOS transistor 141-5 and the MOS transistor 141-3, which receives at its drain the high level voltage generated from the additional decoder 302. Thus, the MOS transistor 141-1 is rendered nonconductive, and the word line WL1 is energized.

When the buffer output signal B11 or B12 is "1", the output signal of the main decoder 301 is set at a low level, so that the MOS transistors 141-1 and 141-5 are not rendered conductive. Thus, the word line WL1 is not energized. When the buffer output signal B13 or B14 is "1", the output signal of the additional decoder 302 is set at a low level, so that the drain voltage on the MOS transistor 141-1 is set at a low level. Thus, the word line WL1 is not energized. Further, when the buffer output signal B15 or B16 is "1", the selection unit 304 produces selection signals SE1 of "0" and $\overline{SE1}$ of "1", so that the MOS transistor 101-0 is rendered nonconductive while the MOS transistor 101-5 is rendered conductive. Thus, a low level output signal is produced from the main decoder 301, and the word line WL1 is not energized as mentioned earlier.

The memory selection unit MS shown in FIG. 4 may be formed with four selection units, which have the same construction as the selection unit shown in FIG. 16 and produce respective selection signals SE1 and $\overline{SE1}$, SE2 and $\overline{SE2}$, SE3 and $\overline{SE3}$, and SE4 and $\overline{SE4}$ according to different combinations of the buffer output signals B15 or $\overline{B15}$ and B16 or $\overline{B16}$. To each of these four selection units are connected four main decoders, which have the same construction as the main decoder shown in FIG. 16 and produce respective high level output signals according to different combinations of the buffer output signals B11 or $\overline{B11}$ and B12 or $\overline{B12}$.

To each of these four main decoders are connected four buffers, which have the same construction as the buffer 303 shown in FIG. 16. To each of the four buffers, which are connected to one of the main decoders, is connected each of four additional decoders, which have the same construction as the additional decoder shown in FIG. 16 and produce respective high level output signals according to different combinations of the buffer output signals B13 or $\overline{B13}$ and B14 or $\overline{B14}$. In other words, as shown in FIG. 9, each of the main decoders 101 to 116 is responsible to select a corresponding one of buffer groups each including four buffers connected to the same main decoder, and each of the additional decoders 117 to 120 is responsible to select a corresponding one of the four buffers included in the selected buffer group.

While some preferred embodiments of the invention have been described in the foregoing, these embodiments are by no means to be considered limiting, and various changes and modifications can be made without departing from the scope and spirit of the invention. For example, while the buffers shown in FIGS. 13 to 16, like those shown in FIG. 11, do not have the MOS transistor 141-0 shown in FIG. 10, in case where the main decoders as shown in FIG. 10 are used it is possible to insert the MOS transistor 141-0 as shown in FIG. 10 as a switching transistor between the MOS transistor 141-4 in each of the buffer and the voltage supply terminal Vc.

What we claim is:

1. An address designation circuit responsive to externally-generated address signals comprising:
    a plurality of first decoding circuits coupled to said address signals;
    a plurality of second decoding circuits coupled to said address signals;
    a plurality of buffer circuits each having a power receiving path and including a plurality of buffers which have first and second input terminals, said first input terminals of all said buffers in each buffer circuit being connected to a different one of said plurality of said first decoding circuits and said second input terminals being connected to said plurality of second decoding circuits; and
    power-down means connected to said power receiving paths of said plurality of buffer circuits for selectively interrupting said power receiving paths.

2. An address designation circuit according to claim 1 further including first and second power supply terminals and wherein each of said second decoding circuits includes first and second output terminals from which output signals in inverted relationship are produced, and wherein each of said buffer circuts includes first resistive means constituting said power receiving path and having one end connected to said power-down means, a first MOS transistor connected between the other end of said first resistive means and the first output terminal of one of said second decoding circuits, and a series circuit including second, third, and fourth MOS transistors, said first and second MOS transistors having gates which are connected to one of said first decoding sections, said third MOS transistor having a gate connected to the second output terminal of said one of said second decoding circuits, and said fourth MOS transistor having its gate connected to the other end of said first resistive means.

3. An address designation circuit according to claim 2 wherein each of said first decoding circuits includes second resistive means having one end connected to said first power supply terminal, a plurality of fifth MOS transistors each having its current path connected at one end to the other end of said second resistive means, and switching means having a current path connected between the other end of the current path of each of said plurality of MOS transistors and to said second power supply terminal.

4. An address designation circuit according to claim 3 wherein each of said second decoding circuits includes third resistive means having one end connected to said first power supply terminal, a plurality of sixth MOS transistors connected between the other end of said second resistive means and said second power supply terminal, and an inverter having an output terminal connected to said first output terminal and an input terminal connected to the other end of said second resistive means and to said second output terminal.

5. An address designation circuit according to claim 4 wherein each of said second decoding circuits further includes fourth resistive means connected between said first power supply terminal and said first output terminal.

* * * * *